United States Patent
Okazaki et al.

(10) Patent No.: US 7,622,228 B2
(45) Date of Patent: Nov. 24, 2009

(54) HALFTONE PHASE SHIFT MASK BLANK, AND METHOD OF MANUFACTURE

(75) Inventors: Satoshi Okazaki, Niigata-ken (JP); Toshinobu Ishihara, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 348 days.

(21) Appl. No.: 11/613,780

(22) Filed: Dec. 20, 2006

(65) Prior Publication Data

US 2007/0099092 A1   May 3, 2007

Related U.S. Application Data

(62) Division of application No. 10/679,264, filed on Oct. 7, 2003, now Pat. No. 7,179,545.

(30) Foreign Application Priority Data

Oct. 8, 2002 (JP) .............................. 2002-294863

(51) Int. Cl.
  *G03F 1/00* (2006.01)
(52) U.S. Cl. ........................................................ 430/5
(58) Field of Classification Search .................. 430/5; 428/428, 430; 204/192.2, 192.11, 192.12, 204/192.15, 192.22
  See application file for complete search history.

(56) References Cited

U.S. PATENT DOCUMENTS

| 5,230,971 A * | 7/1993 | Alpay ............................ 430/5 |
| 5,605,776 A | 2/1997 | Isao et al. |
| 5,714,285 A | 2/1998 | Tu et al. |
| 5,897,976 A | 4/1999 | Carcia et al. |
| 5,942,356 A | 8/1999 | Mitsui et al. |
| 5,952,128 A | 9/1999 | Isao et al. |
| 6,037,083 A | 3/2000 | Mitsui et al. |
| 6,335,124 B1 | 1/2002 | Mitsui et al. |
| 6,677,087 B2 | 1/2004 | Nozawa et al. |
| 7,090,947 B2 * | 8/2006 | Kawada et al. ................. 430/5 |
| 2002/0058186 A1 | 5/2002 | Nozawa et al. |
| 2002/0086220 A1 | 7/2002 | Nozawa et al. |
| 2002/0122991 A1 | 9/2002 | Shiota et al. |

FOREIGN PATENT DOCUMENTS

| JP | 7-140365 A | 6/1995 |
| JP | 2002-72443 A | 3/2002 |
| WO | WO-94/11786 A1 | 5/1994 |

OTHER PUBLICATIONS

Yoshioka at al., "An attentuated phase-shifting mask with a single-layer absorptive shifter", Mitsubishi Denki Giho, 1995, Japan, vol. 69, No. 3, pp. 67-71 (XP 008030088).

\* cited by examiner

*Primary Examiner*—Stephen Rosasco
(74) *Attorney, Agent, or Firm*—Birch, Stewart, Kolasch & Birch, LLP

(57) ABSTRACT

A halftone phase shift mask blank has a phase shifter film on a transparent substrate. The phase shifter film is composed of a metal silicide compound containing Mo, at least one metal selected from Ta, Zr, Cr and W, and at least one element selected from O, N and C. The halftone phase shift mask blank has improved processability and high resistance to chemicals, especially to alkaline chemicals.

5 Claims, 1 Drawing Sheet

HALFTONE PHASE SHIFT MASK BLANK, AND METHOD OF MANUFACTURE

This application is a Divisional of application Ser. No. 10/679,264, filed on Oct. 7, 2003, now U.S. Pat. No. 7,179,545, the entire contents of which are hereby incorporated by reference and for which priority is claimed under 35 U.S.C. § 120.

BACKGROUND OF THE INVENTION

Field of the Invention

This invention relates to halftone phase shift mask blanks to be processed into halftone phase shift masks suitable for use in the microfabrication of semiconductor integrated circuits, color filters for charge coupled devices (CCD) and liquid crystal displays (LCD), magnetic heads or the like.

Typical photomasks known in the art for use in semiconductor microfabrication include binary masks having a chromium film formed on a quartz substrate as a light-shielding film, and halftone phase shift masks having a phase shifter film of MoSi oxide, nitride or oxynitride formed on a quartz substrate (see JP-A 7-140635).

The halftone phase shift mask blanks using MoSi oxide or nitride as the phase shifter film, however, generally have the problem that MoSi base phase shifter films are less resistant to chemicals, especially to alkaline chemicals such as ammonia-hydrogen peroxide water for cleaning. Thus, the phase difference and transmittance of the phase shifter film can be altered during the manufacture of phase shift masks from blanks and upon cleaning of the mask during use.

Also known in the art are halftone phase shift mask blanks using metal silicide compounds other than Mo, for example, ZrSi oxide or nitride as the phase shifter film. These phase shifter films are fully resistant to chemicals, especially to alkaline chemicals such as ammonia-hydrogen peroxide water for cleaning, but they lack in-plane uniformity and are inefficient to process by etching, especially dry etching, for pattern formation. None of prior art halftone phase shift mask blanks are effective to process and resistant to chemicals.

SUMMARY OF THE INVENTION

An object of the present invention is to provide a halftone phase shift mask blank which is effective to process and resistant to chemicals, especially alkaline chemicals, and a method of manufacturing the same.

It has been found that a halftone phase shift mask blank comprising a phase shifter film composed of a metal silicide compound containing molybdenum, at least one metal selected from among tantalum, zirconium, chromium, and tungsten, and at least one element selected from among oxygen, nitrogen, and carbon has the advantage that the phase shifter film has high in-plane uniformity, is effective to process by etching, especially dry etching, and has chemical resistance so that it keeps its transmittance or phase difference unchanged when cleaned with chemicals, especially alkaline chemicals. This halftone phase shift mask blank can be manufactured by using molybdenum silicide as a first target and at least one metal silicide selected from among tantalum silicide, zirconium silicide, chromium silicide, and tungsten silicide as a second target, and carrying out reactive sputtering in the presence of at least one reactive gas containing at least one element selected from among oxygen, nitrogen, and carbon, while applying an electric power to the first and second targets at the same time, thereby forming a phase shifter film of a metal silicide compound on a transparent substrate.

In one aspect, the present invention provides a halftone phase shift mask blank comprising a transparent substrate and a phase shifter film thereon. The phase shifter film is composed of a metal silicide compound containing molybdenum, at least one metal selected from the group consisting of tantalum, zirconium, chromium, and tungsten, and at least one element selected from the group consisting of oxygen, nitrogen, and carbon.

In another aspect, the present invention provides a method of manufacturing a halftone phase shift mask blank, comprising the steps of using molybdenum silicide as a first target and at least one metal silicide selected from the group consisting of tantalum silicide, zirconium silicide, chromium silicide, and tungsten silicide as a second target, and carrying out reactive sputtering in the presence of at least one reactive gas containing at least one element selected from the group consisting of oxygen, nitrogen, and carbon, while applying an electric power to the first and second targets at the same time, thereby forming a phase shifter film of a metal silicide compound on a transparent substrate.

Preferably, in the sputtering step, the surfaces of the first and second targets facing the transparent substrate are inclined at an angle of 30 to 60 degrees to the surface of the transparent substrate on which the phase shifter film is to be formed, and the transparent substrate is rotated about its axis. In a preferred embodiment, the molybdenum silicide as the first target has a molar ratio of silicon to molybdenum of up to 4, and the metal silicide as the second target has a molar ratio of silicon to metal of at least 18. In another preferred embodiment, a DC, pulse DC or RF power supply is used to apply an electric power to the targets.

The preferred metal silicide compound is a silicide oxide, silicide nitride, silicide oxynitride, silicide oxycarbide, silicide nitride carbide or silicide oxide nitride carbide containing molybdenum and at least one metal selected from the group consisting of tantalum, zirconium, chromium, and tungsten.

DESCRIPTION OF THE PREFERRED EMBODIMENTS

Figure 1:
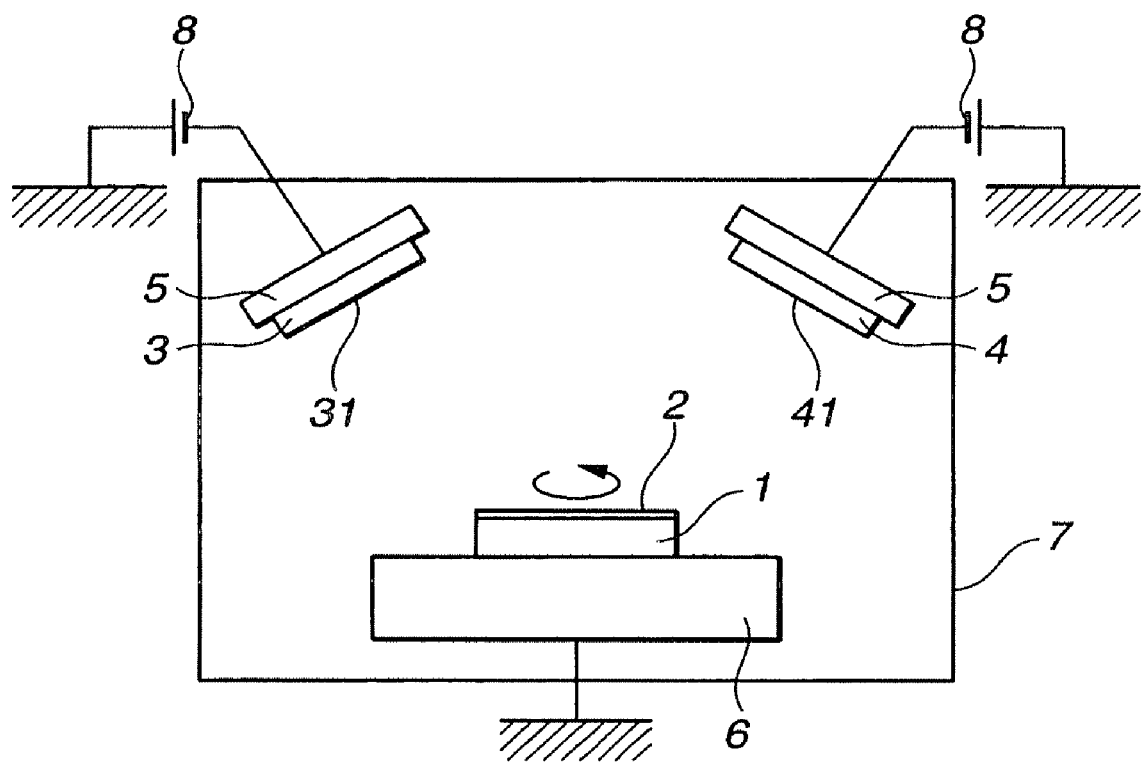
FIG. 1 schematically illustrates a sputtering apparatus for use in the manufacture of a halftone phase shift mask blank according to one embodiment of the invention.

The halftone phase shift mask blank of the invention has a phase shifter film on a transparent substrate. The phase shifter film is composed of a metal silicide compound which contains molybdenum as a first metal component, at least one metal selected from among tantalum, zirconium, chromium, and tungsten as a second metal component, and at least one element selected from among oxygen, nitrogen, and carbon.

Preferred examples of the metal silicide compound include a silicide oxide, silicide nitride, silicide oxynitride, silicide oxycarbide, silicide nitride carbide, and silicide oxide nitride carbide containing molybdenum as the first metal component and at least one metal selected from among tantalum, zirconium, chromium, and tungsten as the second metal component, as represented by MoMSiO, MoMSiN, MoMSiON, MoMSiOC, MoMSiNC, and MoMSiONC wherein M is the second metal component, that is at least one metal selected from among Ta, Zr, Cr, and W. More preferred are molybdenum tantalum silicide oxynitride (MoTaSiON), molybdenum zirconium silicide oxynitride (MoZrSiON), molybdenum chromium silicide oxynitride (MoCrSiON), molybdenum tungsten silicide oxynitride (MoWSiON), molybdenum tantalum silicide oxide nitride carbide (MoTaSiONC), molybdenum zirconium silicide oxide nitride carbide (MoZrSiONC), molybdenum chromium silicide oxide nitride carbide (MoCrSiONC), and molybdenum tungsten silicide oxide nitride carbide (MoWSiONC).

In the metal silicide compound, the first metal component (Mo) and the second metal component (Ta, Zr, Cr or W) are preferably present in an atomic ratio between 100:1 and 2:1, especially between 20:1 and 4:1, provided that the amount of the second metal component is the total amount if two or more metal elements are included. Too high a proportion of the first metal component may result in a phase shifter film with insufficient chemical resistance whereas too low a proportion of the first metal component may result in a phase shifter film having poor in-plane uniformity and the difficulty of processing by etching.

In the metal silicide compound, the total content of first and second metal components is preferably 1 to 20 at %, especially 3 to 15 at %, and the content of silicon is preferably 20 to 70 at %, especially 30 to 60 at %.

The content of oxygen, nitrogen and carbon in the metal silicide compound is not critical. Where oxygen and nitrogen are contained, that is, in the case of metal silicide oxynitride, it is preferred that the oxygen content be 3 to 30 at %, especially 5 to 15 at % and the nitrogen content be 10 to 60 at %, especially 20 to 50 at %. Where oxygen, nitrogen and carbon are contained, that is, in the case of metal silicide oxide nitride carbide, it is preferred that the oxygen content be 3 to 30 at %, especially 5 to 15 at %, the nitrogen content be 10 to 60 at %, especially 20 to 60 at %, and the carbon content be 1 to 10 at %, especially 1 to 5 at %.

The thickness of the phase shifter film varies with the exposure wavelength during use of the halftone phase shifter film, the transmittance of the phase shifter film, the quantity of phase shift or the like. Preferably, the phase shifter film has a thickness of 500 to 1700 Å (50 to 170 nm), especially 600 to 1300 Å (60 to 130 nm), and a transmittance of 3 to 30%, especially 5 to 20%.

It is now described how to manufacture the halftone phase shift mask blank of the invention.

Briefly stated, a halftone phase shift mask blank is manufactured by furnishing a substrate which is transmissive to exposure light, such as a transparent substrate of quartz or $CaF_2$, a first target of molybdenum silicide, and a second target of at least one metal silicide selected from among tantalum silicide, zirconium silicide, chromium silicide, and tungsten silicide, and carrying out reactive sputtering in the presence of at least one reactive gas containing at least one element selected from among oxygen, nitrogen, and carbon, while applying an electric power to the first and second targets at the same time, thereby forming a phase shifter film of a metal silicide compound on the substrate.

The phase shifter film of a silicide compound containing two or more metal elements might be formed using a silicide target containing both first and second metal elements. In order to form a phase shifter film having good processability or high in-plane uniformity, the silicide target used must be homogeneous. However, it is difficult to prepare a fully homogeneous target that contains two or more metal elements. In contrast, using two or more silicide targets each containing a single metal element rather than a silicide target containing two or more metal elements, the method of the present invention is successful in forming a phase shifter film of a silicide compound containing two or more metal elements having good processability or high in-plane uniformity.

In the method of the invention, molybdenum silicide is used as the first target, and at least one metal silicide selected from among tantalum silicide, zirconium silicide, chromium silicide, and tungsten silicide is used as the second target.

In the molybdenum silicide as the first target, the molar ratio of silicon to molybdenum is preferably up to 4, more preferably up to 3, most preferably about 2. In the metal silicide as the second target, the molar ratio of silicon to metal, i.e., tantalum, zirconium, chromium or tungsten, is preferably at least 18, more preferably at least 19, most preferably at least 20. When the ratio of silicon to molybdenum in the molybdenum silicide as the first target and the ratio of silicon to metal in the metal silicide as the second target are controlled to fall within the above ranges, it becomes possible that the resulting metal silicide compound contain much molybdenum relative to tantalum, zirconium, chromium or tungsten, which is effective for optimizing the in-plane uniformity and chemical resistance of the phase shifter film.

In the method of the invention, at least one reactive gas containing at least one element selected from among oxygen, nitrogen, and carbon is used. The reactive gas used may be any gas selected from, for example, oxygen gas, nitrogen gas, nitrogen monoxide gas, nitrogen dioxide gas, nitrous oxide gas, carbon monoxide gas, and carbon dioxide gas. Using any one or more of these gases, a silicide oxide, silicide nitride, silicide oxynitride, silicide oxycarbide, silicide nitride carbide or silicide oxide nitride carbide containing the two metal species can be formed. The reactive gas may be used alone or in combination with an inert gas such as helium or argon.

The power supply for applying a power to the target in the inventive method is not critical. Any of power supplies known for sputtering may be used. Preferably, a DC power supply, pulse DC power supply or RF power supply is used to apply a power to the target. The power supplies for the first and second targets may be the same or different. It is preferred to use a DC power supply for the first target and a pulse DC power supply for the second target, because the influence of charge-up and the occurrence of defects in the film can be suppressed even when the second target has a high silicon content.

Referring to FIG. 1, there is illustrated a sputtering apparatus. The apparatus includes a transparent substrate 1 having an upper surface on which a phase shifter film 2 is to be formed, a first target 3 of molybdenum silicide, and a second target 4 of tantalum silicide, zirconium silicide, chromium silicide or tungsten silicide, which are accommodated in a chamber 7. Also included are cathode electrodes 5 in close contact with the targets 3 and 4, an anode electrode 6 serving as a substrate-supporting rotating platform, and power supplies 8 connected to the cathode electrodes 5. In a preferred embodiment, the surfaces 31 and 41 of the first and second targets 3 and 4 facing the substrate 1 are inclined at an angle of 30 to 60 degrees to the upper surface of the substrate, and the substrate 1 is rotated about its axis perpendicular to the upper surface. By sputtering with the targets inclined (for oblique deposition) and the substrate being rotated about its axis, the phase shifter film of metal silicide compound being deposited is improved in in-plane uniformity, especially in-plane uniformity of film composition. As a result, a halftone phase shift mask blank which is significantly improved in processability is obtained.

In the illustrated apparatus of FIG. 1, the first and second targets are used each one. The invention is not limited to this embodiment. Where two or more metal silicides are used as the second target, a corresponding plurality of second targets are disposed in the chamber. It is also acceptable to use a plurality of targets of the same composition. It is preferred that the targets be disposed at equal intervals in a circumferential direction of the rotating substrate.

It is noted that a light-shielding film may be formed on the phase shifter film, and an antireflection film be formed on the light-shielding film for reducing reflection from the light-shielding film.

The light-shielding film or antireflection film used herein may be a chromium base film such as chromium oxynitride (CrON), chromium oxycarbide (CrOC) or chromium oxide nitride carbide (CrONC) or a laminate of such films.

The chromium-base light-shielding film or antireflection film may be deposited by reactive sputtering. Specifically the target used is chromium alone or a chromium compound of chromium combined with oxygen, nitrogen or carbon or a mixture thereof. The sputtering gas used is an inert gas such as argon or krypton, optionally in admixture with a gas serving as an oxygen, carbon and/or nitrogen source, for example, oxygen gas, nitrogen gas, nitrogen monoxide gas, nitrogen dioxide gas, nitrous oxide gas, carbon monoxide gas, carbon dioxide gas or a hydrocarbon gas (e.g., methane).

EXAMPLE

Examples and comparative examples are given below by way of illustration, and are not intended to limit the scope of the invention.

Example 1

In an oblique incident double cathode sputtering apparatus as shown in FIG. 1, a 6" square quartz substrate which had been preheated at 120° C. in a preheating chamber, a first target of MoSi (Mo:Si=1:2, 8.5", diameter×5 mm, inclination angle 40 degrees), and a second target of ZrSi (Zr:Si=1:20, 8.5" diameter×5 mm, inclination angle 40 degrees) were placed. By flowing 50 sccm of Ar, 10 sccm of $N_2$ and 2 sccm of $O_2$ as the sputtering gas through the chamber, applying a DC power of 250 W to the first target and a pulse DC power of 200 W to the second target at the same time, and rotating the substrate about its axis at 20 rpm, plasma sputtering was carried out for 6 minutes. A MoZrSiON film of 780 Å thick was deposited on the substrate, yielding a halftone phase shift mask blank. The film composition of the halftone phase shift mask blank was analyzed by ESCA, with the results shown in Table 1. The properties (transmittance, phase difference, refractive index and thickness) of the film were determined, with the results shown in Table 2.

Additionally, the phase shifter film was evaluated for chemical resistance and in-plane uniformity.

Chemical Resistance

The halftone phase shift mask blank was immersed in a chemical solution (SC1 reagent, aqueous ammonia-hydrogen peroxide mixture obtained by mixing aqueous ammonia, aqueous hydrogen peroxide and pure water in a volume ratio of 1:1:40) at room temperature (25° C.) for one hour. Changes of transmittance and phase difference of the phase shifter film before and after the immersion were determined. The results are shown in Table 3.

In-Plane Uniformity

On the phase shifter film of the halftone phase shift mask blank, an EB resist ZEP-7000 (Nippon Zeon Co., Ltd.) was coated to a thickness of 3,500 Å and soft-baked at 200° C. The resist film was then exposed to a pattern of electron beam by means of an EB lithography system ELS-3700 (Elionix Co., Ltd.), and developed with a developer AD10 (Tama Chemicals Co., Ltd.) to form a 0.50 µm wide line-and-space (L&S) resist pattern. Using the resist pattern as a mask, dry etching with $CF_4/O_2$ gas was carried out by means of a dry etcher RIE-10NR (SAMCO International Inc.) for forming a L&S pattern in the phase shifter film. The resist pattern was removed, leaving a patterned sample. A 120 mm×120 mm square at the center of the substrate of the patterned sample was divided at intervals of 10 mm to define 12×12 (total 144) areas. In the areas, the critical dimension (CD) of the L&S pattern in the phase shifter film was measured, from which an average value and a range (difference between line width maximum and minimum) were determined for evaluating in-plane uniformity. The results are shown in Table 4.

Comparative Example 1

In an oblique incident double cathode sputtering apparatus as shown in FIG. 1, a 6" square quartz substrate which had been preheated at 120° C. in a preheating chamber, and first and second targets of MoSi (Mo:Si=1:8, 8.5" diameter×5 mm, inclination angle 40 degrees) were placed. By flowing 50 sccm of Ar, 10 sccm of $N_2$ and 2 sccm of $O_2$ as the sputtering gas through the chamber, applying a DC power of 200 W to the first and second targets at the same time, and rotating the substrate about its axis at 20 rpm, plasma sputtering was carried out for 7 minutes. A MoSiON film of 730 Å thick was deposited on the substrate, yielding a halftone phase shift mask blank. The film composition of the halftone phase shift mask blank as analyzed by ESCA is shown in Table 1. The properties of the film are shown in Table 2.

The phase shifter film was similarly evaluated for chemical resistance and in-plane uniformity, with the results shown in Tables 3 and 4, respectively.

Comparative Example 2

In an oblique incident double cathode sputtering apparatus as shown in FIG. 1, a 6" square quartz substrate which had been preheated at 120° C. in a preheating chamber, and first and second targets of ZrSi (Zr:Si=1:8, 8.5" diameter×5 mm, inclination angle 40 degrees) were placed. By flowing 50 sccm of Ar, 10 sccm of $N_2$ and 3 sccm of $O_2$ as the sputtering gas through the chamber, applying a DC power of 220 W to the first and second targets at the same time, and rotating the substrate about its axis at 20 rpm, plasma sputtering was carried out for 8 minutes. A ZrSiON film of 830 Å thick was deposited on the substrate, yielding a halftone phase shift mask blank. The film composition of the halftone phase shift mask blank as analyzed by ESCA is shown in Table 1. The properties of the film are shown in Table 2.

The phase shifter film was similarly evaluated for chemical resistance and in-plane uniformity, with the results shown in Tables 3 and 4, respectively.

Example 2

In an oblique incident double cathode sputtering apparatus as shown in FIG. 1, a 6" square quartz substrate which had been preheated at 100° C. in a preheating chamber, a first target of MoSi (Mo:Si=1:2, 8.5" diameter×5 mm, inclination angle 40 degrees), and a second target of TaSi (Ta:Si=1:22, 8.5" diameter×5 mm, inclination angle 40 degrees) were placed. By flowing 50 sccm of Ar, 10 sccm of $N_2$ and 1.5 sccm of $O_2$ as the sputtering gas through the chamber, applying a DC power of 250 W to the first target and a pulse DC power of 220 W to the second target at the same time, and rotating the substrate about its axis at 20 rpm, plasma sputtering was carried out for 7 minutes. A MoTaSiON film of 750 Å thick was deposited on the substrate, yielding a halftone phase shift mask blank. The film composition of the halftone phase shift mask blank as analyzed by ESCA is shown in Table 1. The properties of the film are shown in Table 2.

The phase shifter film was similarly evaluated for chemical resistance and in-plane uniformity, with the results shown in Tables 3 and 4, respectively.

Example 3

In an oblique incident double cathode sputtering apparatus as shown in FIG. 1, a 6" square quartz substrate which had been preheated at 100° C. in a preheating chamber, a first target of MoSi (Mo:Si=1:2, 8.5" diameter×5 mm, inclination angle 40 degrees), and a second target of CrSi (Cr:Si=1:19, 8.5" diameter×5 mm, inclination angle 40 degrees) were placed. By flowing 50 sccm of Ar, 10 sccm of $N_2$ and 3 sccm of $O_2$ as the sputtering gas through the chamber, applying a DC power of 250 W to the first target and a pulse DC power of 220 W to the second target at the same time, and rotating the substrate about its axis at 20 rpm, plasma sputtering was carried out for 7 minutes. A MoCrSiON film of 880 Å thick was deposited on the substrate, yielding a halftone phase shift mask blank. The film composition of the halftone phase shift mask blank as analyzed by ESCA is shown in Table 1. The properties of the film are shown in Table 2.

The phase shifter film was similarly evaluated for chemical resistance and in-plane uniformity, with the results shown in Tables 3 and 4, respectively.

Example 4

In an oblique incident double cathode sputtering apparatus as shown in FIG. 1, a 6" square quartz substrate which had been preheated at 100° C. in a preheating chamber, a first target of MoSi (Mo:Si=1:2, 8.5" diameter×5 mm, inclination angle 40 degrees), and a second target of WSi (W:Si=1:20, 8.5" diameter×5 mm, inclination angle 40 degrees) were placed. By flowing 50 sccm of Ar, 10 sccm of $N_2$ and 2 sccm of $O_2$ as the sputtering gas through the chamber, applying a DC power of 250 W to the first target and a pulse DC power of 220 W to the second target at the same time, and rotating the substrate about its axis at 20 rpm, plasma sputtering was carried out for 6 minutes. A MoWSiON film of 810 Å thick was deposited on the substrate, yielding a halftone phase shift mask blank. The film composition of the halftone phase shift mask blank as analyzed by ESCA is shown in Table 1. The properties of the film are shown in Table 2.

The phase shifter film was similarly evaluated for chemical resistance and in-plane uniformity, with the results shown in Tables 3 and 4, respectively.

TABLE 1

| | Composition (at %) | | | | | | | |
|---|---|---|---|---|---|---|---|---|
| | Mo | Zr | Ta | Cr | W | Si | O | N |
| Example 1 | 4.3 | 0.6 | — | — | — | 48.2 | 7.8 | 32.6 |
| Comparative Example 1 | 5.5 | — | — | — | — | 43.0 | 8.6 | 35.8 |
| Comparative Example 2 | — | 5.2 | — | — | — | 40.1 | 12.6 | 32.4 |
| Example 2 | 4.0 | — | 1.2 | — | — | 44.0 | 6.8 | 38.3 |
| Example 3 | 3.8 | — | — | 0.6 | — | 41.0 | 12.6 | 32.3 |
| Example 4 | 4.8 | — | — | — | 0.6 | 52.0 | 7.2 | 29.5 |

TABLE 2

| | Transmittance* (%) | Phase difference* (°) | Refractive index* | Film thickness (Å) |
|---|---|---|---|---|
| Example 1 | 6.20 | 176.2 | 2.19 | 780 |
| Comparative Example 1 | 6.10 | 172.5 | 2.21 | 730 |
| Comparative Example 2 | 5.81 | 168.5 | 2.02 | 830 |
| Example 2 | 5.54 | 182.0 | 2.31 | 750 |
| Example 3 | 6.52 | 178.3 | 2.07 | 880 |
| Example 4 | 5.34 | 185.7 | 2.26 | 810 |

*measurement wavelength 193 nm

TABLE 3

| | Before immersion | | After immersion | | Change | |
|---|---|---|---|---|---|---|
| | Transmittance* (%) | Phase difference* (°) | Transmittance* (%) | Phase difference* (°) | Transmittance* (%) | Phase difference* (°) |
| Example 1 | 6.20 | 176.2 | 6.20 | 176.0 | <1 | <1 |
| Comparative Example 1 | 6.10 | 172.5 | 7.53 | 160.8 | >1 | >1 |
| Comparative Example 2 | 5.81 | 168.5 | 5.83 | 168.3 | <1 | <1 |
| Example 2 | 5.54 | 182.0 | 5.56 | 182.0 | <1 | <1 |
| Example 3 | 6.52 | 178.3 | 6.55 | 177.8 | <1 | <1 |
| Example 4 | 5.34 | 185.7 | 5.38 | 184.9 | <1 | <1 |

*measurement wavelength 193 nm

TABLE 4

| | Line width (nm) | |
| --- | --- | --- |
| | Average | Range |
| Example 1 | 488 | 21 |
| Comparative Example 1 | 483 | 34 |
| Comparative Example 2 | 432 | 112 |
| Example 2 | 466 | 32 |
| Example 3 | 482 | 42 |
| Example 4 | 455 | 55 |

The above results demonstrate that the halftone phase shift mask blanks of Examples have improved chemical resistance, high in-plane uniformity and excellent processability, whereas the phase shifter films of Comparative Examples lack either of chemical resistance and processability.

There have been described halftone phase shift mask blanks of quality having improved processability and high resistance to chemicals, especially to alkaline chemicals.

Japanese patent application No. 2002-294863 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of manufacturing a halftone phase shift mask blank, comprising the steps of:

using molybdenum silicide as a first target and at least one metal silicide selected from the group consisting of tantalum silicide, zirconium silicide, chromium silicide, and tungsten silicide as a second target, and carrying out reactive sputtering in the presence of at least one reactive gas containing at least one element selected from the group consisting of oxygen, nitrogen, and carbon, while applying an electric power to the first and second targets at the same time, thereby forming a phase shifter film of a metal silicide compound on a transparent substrate.

2. The method of claim 1 wherein in the sputtering step, the surfaces of the first and second targets facing the transparent substrate are inclined at an angle of 30 to 60 degrees to the surface of the transparent substrate on which the phase shifter film is to be formed, and the transparent substrate is rotated about its axis.

3. The method of claim 1 wherein the molybdenum silicide as the first target has a molar ratio of silicon to molybdenum of up to 4, and the metal silicide as the second target has a molar ratio of silicon to metal of at least 18.

4. The method of claim 1 wherein said metal silicide compound is a silicide oxide, silicide nitride, silicide oxynitride, silicide oxycarbide, silicide nitride carbide or silicide oxide nitride carbide containing molybdenum and at least one metal selected from the group consisting of tantalum, zirconium, chromium, and tungsten.

5. The method of claim 1 wherein a DC, pulse DC or RF power supply is used to apply an electric power to the targets.

* * * * *